US010354983B2

(12) United States Patent
Yu et al.

(10) Patent No.: US 10,354,983 B2
(45) Date of Patent: Jul. 16, 2019

(54) INTEGRATED CIRCUIT PACKAGE AND METHODS OF FORMING SAME

(71) Applicant: Taiwan Semiconductor Manufacturing Company, Ltd., Hsinchu (TW)

(72) Inventors: Chen-Hua Yu, Hsinchu (TW); Kuo-Chung Yee, Taoyuan (TW); Mirng-Ji Lii, Sinpu Township (TW); Chien-Hsun Lee, Chu-tung Town (TW); Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/594,209

(22) Filed: May 12, 2017

(65) Prior Publication Data

US 2017/0250170 A1    Aug. 31, 2017

Related U.S. Application Data

(62) Division of application No. 14/252,232, filed on Apr. 14, 2014, now Pat. No. 9,653,442.

(Continued)

(51) Int. Cl.
*H01L 23/528* (2006.01)
*H01L 25/18* (2006.01)
(Continued)

(52) U.S. Cl.
CPC .......... *H01L 25/18* (2013.01); *H01L 21/4853* (2013.01); *H01L 21/56* (2013.01);
(Continued)

(58) Field of Classification Search
CPC . H01L 25/043; H01L 25/0657; H01L 25/074; H01L 25/0756; H01L 25/117; H01L 23/12–15; H01L 23/538–5389
See application file for complete search history.

(56) References Cited

U.S. PATENT DOCUMENTS 6,204,562 B1 * 3/2001 Ho .................... H01L 23/49816
257/723
6,369,448 B1 * 4/2002 McCormick ........ H01L 25/0652
257/723

(Continued)

FOREIGN PATENT DOCUMENTS

TW    200929388 A    7/2009
TW    201140792      11/2011
TW    201243970      11/2012

OTHER PUBLICATIONS

Kurita et al., "SMAFTI Package Technology Features Wide-Band and Large-Capacity Memory", Innovative Common Technologies to Support State-of-the-Art Products, pp. 52-56.

(Continued)

*Primary Examiner* — Jarrett J Stark
(74) *Attorney, Agent, or Firm* — Slater Matsil, LLP

(57) ABSTRACT

An embodiment package-on-package (PoP) device includes a package structure, a package substrate, and a plurality of connectors bonding the package structure to the package substrate. The package structure includes a logic chip bonded to a memory chip, a molding compound encircling the memory chip, and a plurality of conductive studs extending through the molding compound. The plurality of conductive studs is attached to contact pads on the logic chip.

19 Claims, 16 Drawing Sheets

Related U.S. Application Data

(60) Provisional application No. 61/928,887, filed on Jan. 17, 2014.

(51) Int. Cl.
*H01L 25/00* (2006.01)
*H01L 23/00* (2006.01)
*H01L 25/10* (2006.01)
*H01L 23/538* (2006.01)
*H01L 23/498* (2006.01)
*H01L 21/48* (2006.01)
*H01L 21/56* (2006.01)
*H01L 23/31* (2006.01)

(52) U.S. Cl.
CPC .... *H01L 23/3107* (2013.01); *H01L 23/49811* (2013.01); *H01L 23/49816* (2013.01); *H01L 23/5384* (2013.01); *H01L 23/5385* (2013.01); *H01L 23/5389* (2013.01); *H01L 24/17* (2013.01); *H01L 24/19* (2013.01); *H01L 24/81* (2013.01); *H01L 25/105* (2013.01); *H01L 25/50* (2013.01); *H01L 21/561* (2013.01); *H01L 21/568* (2013.01); *H01L 23/3114* (2013.01); *H01L 23/3128* (2013.01); *H01L 24/16* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/0401* (2013.01); *H01L 2224/04105* (2013.01); *H01L 2224/12105* (2013.01); *H01L 2224/16113* (2013.01); *H01L 2224/16145* (2013.01); *H01L 2224/16227* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/48464* (2013.01); *H01L 2224/73204* (2013.01); *H01L 2224/73209* (2013.01); *H01L 2224/73265* (2013.01); *H01L 2224/81005* (2013.01); *H01L 2224/81192* (2013.01); *H01L 2224/81193* (2013.01); *H01L 2224/81815* (2013.01); *H01L 2224/83005* (2013.01); *H01L 2224/92124* (2013.01); *H01L 2224/92125* (2013.01); *H01L 2225/0651* (2013.01); *H01L 2225/06513* (2013.01); *H01L 2225/06517* (2013.01); *H01L 2225/06562* (2013.01); *H01L 2225/06568* (2013.01); *H01L 2225/1023* (2013.01); *H01L 2225/1035* (2013.01); *H01L 2225/1058* (2013.01); *H01L 2924/00014* (2013.01); *H01L 2924/1431* (2013.01); *H01L 2924/1434* (2013.01); *H01L 2924/1436* (2013.01); *H01L 2924/14335* (2013.01); *H01L 2924/14361* (2013.01); *H01L 2924/15311* (2013.01); *H01L 2924/15331* (2013.01); *H01L 2924/181* (2013.01); *H01L 2924/18161* (2013.01); *H01L 2924/18162* (2013.01)

(56) References Cited

U.S. PATENT DOCUMENTS

| | | | |
|---|---|---|---|
| 6,613,606 B1* | 9/2003 | Lee | H01L 21/563 257/E21.503 |
| 6,774,473 B1* | 8/2004 | Shen | H01L 24/32 257/686 |
| 7,084,513 B2* | 8/2006 | Matsuki | H01L 23/3114 257/685 |
| 7,528,005 B2* | 5/2009 | Takahashi | H01L 23/3107 257/E23.001 |
| 7,795,721 B2* | 9/2010 | Kurita | H01L 21/563 257/690 |
| 8,008,121 B2* | 8/2011 | Choi | H01L 24/29 257/127 |
| 8,022,523 B2* | 9/2011 | Chen | H01L 23/5385 257/686 |
| 8,148,806 B2* | 4/2012 | Lin | H01L 25/0657 257/202 |
| 8,455,995 B2* | 6/2013 | Tsai | H01L 21/486 257/698 |
| 8,525,314 B2* | 9/2013 | Haba | H01L 23/49833 257/678 |
| 8,642,381 B2* | 2/2014 | Pagaila | H01L 21/561 257/E21.511 |
| 8,716,859 B2* | 5/2014 | Meyer | H01L 25/0655 257/738 |
| 8,930,647 B1 | 1/2015 | Smith | |
| 8,987,884 B2* | 3/2015 | Chen | H01L 23/49827 257/685 |
| 9,564,400 B2* | 2/2017 | Mahnkopf | H01L 25/0657 |
| 9,564,416 B2* | 2/2017 | Hou | H01L 23/5389 |
| 9,640,458 B2* | 5/2017 | Ye | H01L 21/561 |
| 9,653,443 B2* | 5/2017 | Cheng | H01L 25/50 |
| 9,768,090 B2* | 9/2017 | Liang | H01L 23/145 |
| 9,780,072 B2* | 10/2017 | Jeng | H01L 25/0652 |
| 2007/0023887 A1 | 2/2007 | Matsui | |
| 2008/0128882 A1* | 6/2008 | Baek | H01L 21/568 257/686 |
| 2009/0008762 A1* | 1/2009 | Jung | H01L 23/5389 257/686 |
| 2009/0152708 A1* | 6/2009 | Lee | H01L 23/5384 257/690 |
| 2009/0309212 A1 | 12/2009 | Shim et al. | |
| 2010/0244241 A1* | 9/2010 | Marimuthu | H01L 21/561 257/737 |
| 2011/0068427 A1* | 3/2011 | Paek | H01L 24/19 257/433 |
| 2012/0205795 A1 | 8/2012 | Kim et al. | |
| 2013/0119549 A1 | 5/2013 | Cheng et al. | |
| 2013/0182402 A1 | 7/2013 | Chen et al. | |
| 2013/0200528 A1* | 8/2013 | Lin | H01L 21/76877 257/774 |
| 2015/0187743 A1* | 7/2015 | Yu | H01L 25/50 257/774 |
| 2015/0206866 A1* | 7/2015 | Yu | H01L 25/18 257/738 |
| 2019/0051609 A1* | 2/2019 | Hsu | H01L 21/565 |

OTHER PUBLICATIONS

Motohashi et al., "SMAFTI Package with Planarized Multilayer Interconnects", IEEE, Electronic Components and Technology Conference, 2009, pp. 599-606.

Kurita et al., "SMAFTI Packaging Technology for New Interconnect Hierarchy", IEEE, NEC Electronics Corporation Sagamihara, Kanagawa, 229-1198, Japan, 2009, pp. 220-222.

* cited by examiner

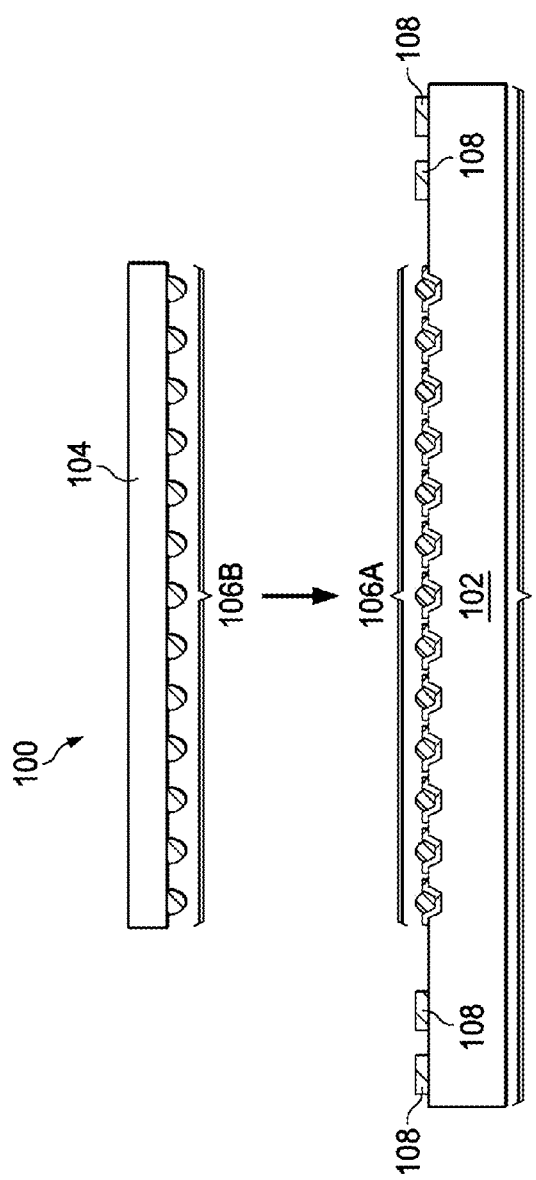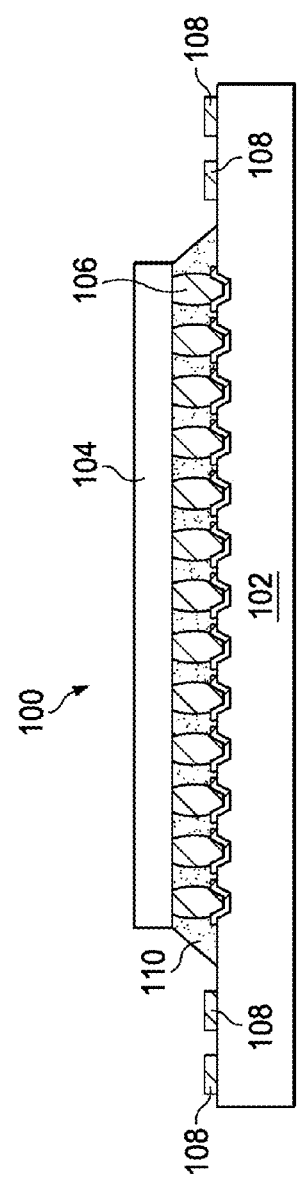

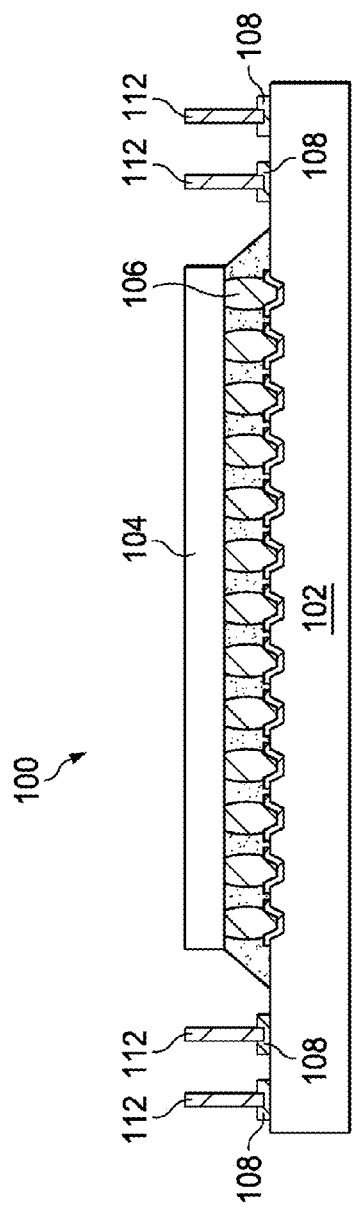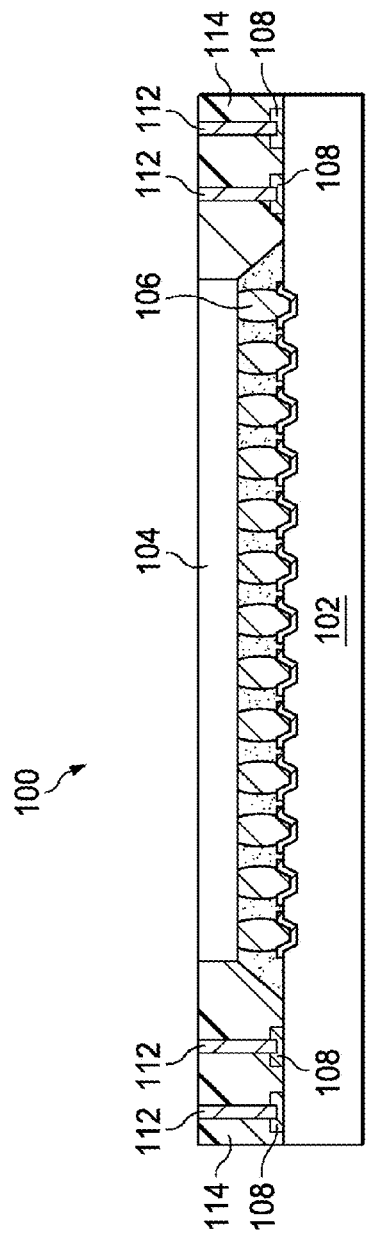

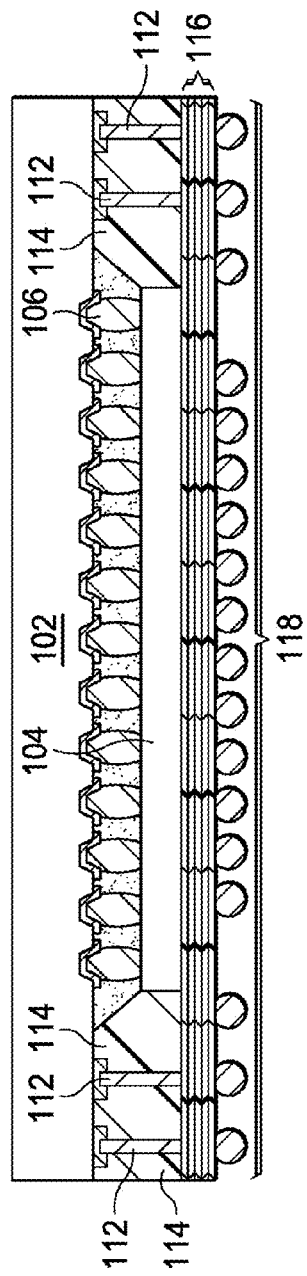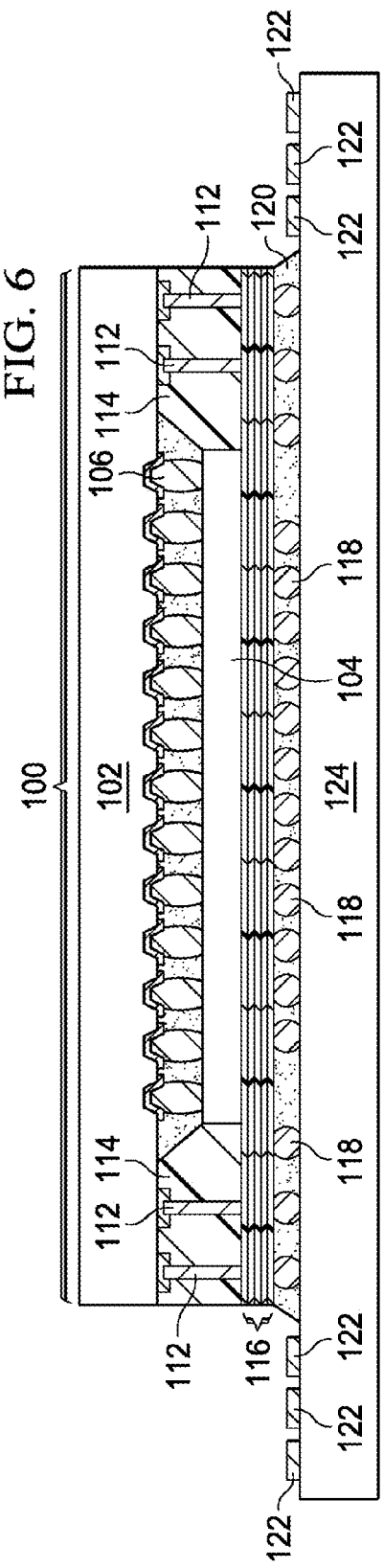

INTEGRATED CIRCUIT PACKAGE AND METHODS OF FORMING SAME

PRIORITY CLAIM AND CROSS-REFERENCE

This application is a divisional of U.S. patent Ser. No. 14/252,232, filed on Apr. 14, 2014, entitled "Integrated Circuit Package and Methods of Forming Same," which claims the benefit of U.S. Provisional Application No. 61/928,887, filed on Jan. 17, 2014, entitled "Integrated Circuit Package and Methods of Forming Same," which applications are hereby incorporated herein by reference.

BACKGROUND 3D package applications such as package-on-package (PoP) are becoming increasingly popular and widely used in mobile devices because they can enhance electrical performance by increasing bandwidth and shortening routing distance between logic chips (e.g., application processors) and memory chips, for instance. However, with the advent of wide input/output (wide IO) memory chips, higher speed and lower power requirements, package body size, and the number of package layers requirements are increasing. Larger and thicker devices and the physical dimensions electrical performances are becoming constrained. Existing PoP devices are challenged to meet fine channels and high density routing requirements using conventional ball joint packages due to yield loss at the ball joint. Improved devices and methods of manufacturing the same are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 through 10 illustrate cross-sectional views of various intermediate stages of manufacturing a PoP device in accordance with some embodiments;

DETAILED DESCRIPTION

Figure 7:
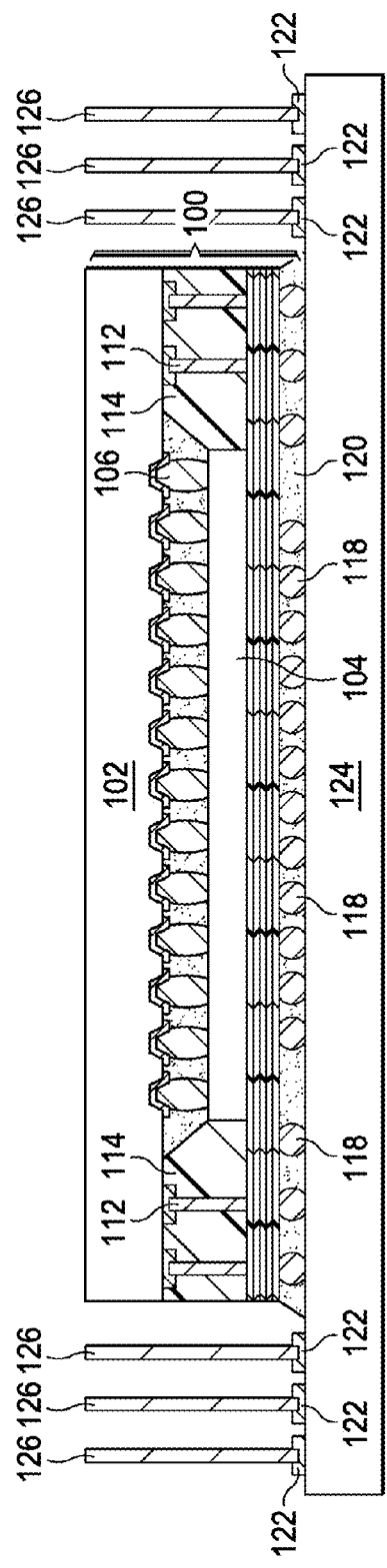

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include PoP devices having logic and memory chips. Interconnections between the logic and memory chips may be done using fan-out, chip-on-chip, and chip-on-substrate structures. These structures allow for improved distribution of IO pads for each chip, allowing for various advantages over existing PoP devices. For example, various embodiments can meet system in package (SiP) fine ball pitch requirements for interconnecting logic chips (e.g., application processors (AP)) with wide IO memory stacking. Other advantageous features may include improved speed and power consumption, lower manufacturing costs, increased capacity, improved yield, thinner form factors, improved level 2 reliability margins, and the like.

FIGS. 1 through 10 illustrate cross-sectional views of various intermediate stages of manufacturing a PoP device 200 (see FIG. 10) in accordance with some embodiments. In FIGS. 1 through 5, a chip-on-chip package structure 100 is formed. FIG. 1 illustrates a cross sectional view of two semiconductor chips, such as logic chip 102 and memory chip 104. Logic chip 102 may be an application processor (AP), although other kinds of semiconductor chips (e.g., memory chips) may be used as well. Memory chip 104 may be a wide input/output (IO) memory chip (e.g., having a thousand or more connectors 106B/contact pads), although other kinds of semiconductor chips (e.g., other types of memory chips) may be used as well. In some example embodiments, logic chip 102 and memory chip 104 may each have a thickness of about 40 µm to about 300 µm.

Connectors 106A and 106B may be disposed on logic chip 102 and memory chip 104, respectively. In some embodiments, connectors 106A and 106B may be microbumps (µbumps) having a pitch of about 30 µm to about 100 µm. Contact pads 108 may also be disposed on a top surface of logic chip 102. As illustrated by FIG. 1, logic chip 102 may have a larger lateral dimension than memory chip 104, which allows contact pads 108 to be disposed at peripheral regions of logic chip 102 while still providing sufficient connectors 106A for bonding to connectors 106 of memory chip 104.

Next, as illustrated by FIG. 2, logic chip 102 and memory chip 104 are bonded. For example, a reflow may be performed on connectors 106A and 106B (illustrated as bonded connectors 106 in FIG. 2). Subsequently, an underfill 110 may be dispensed between logic chip 102 and memory chip 104 around connectors 106. Underfill 110 may provide support for connectors 106. After bonding, contact pads 108 may remain exposed on a top surface of logic chip 102. In some embodiments, bonded connectors 106 may have a standoff height of about 30 µm to about 100 µm.

Figure 26A:
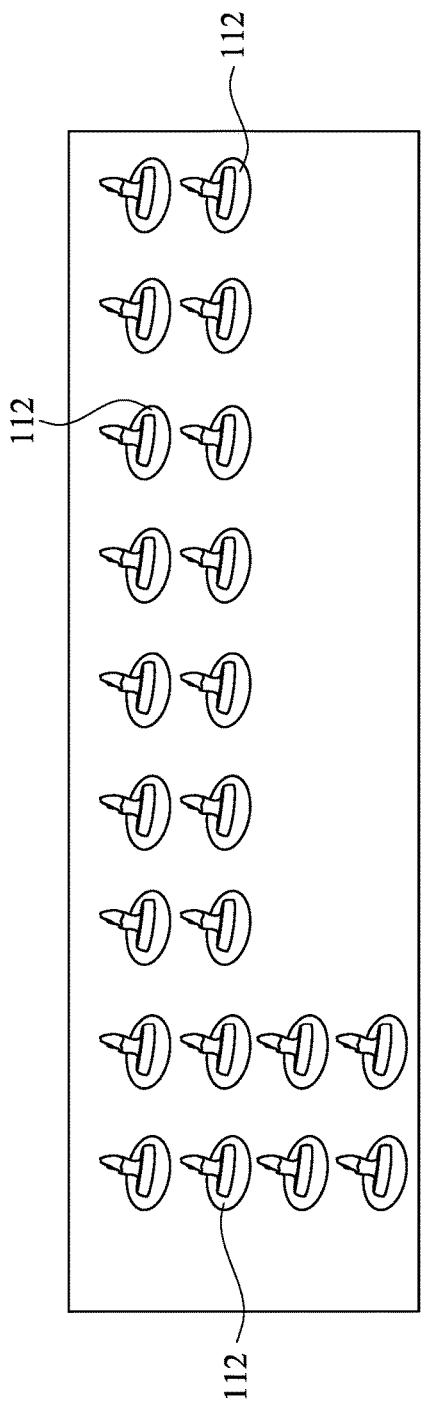
FIGS. 26A and 26B illustrate perspective and cross-sectional views of conductive studs in accordance with some embodiments.
Figure 26B:
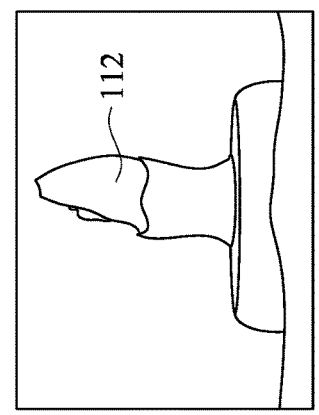

FIG. 3 illustrates the attachment of conductive studs 112 to contact pads 108. Conductive studs 112 may be formed of a conductive material such as copper, gold, silver, and the like. Conductive studs 112 may be pre-formed structures that are attached to contact pads 108. For example, FIGS. 26A and 26B illustrate perspective and cross-sectional views of example conductive studs 112. Conductive studs 112 may be mounted to contact pads 108 by a wire bonder or other suitable apparatus. In some embodiments, conductive studs 112 may have a pitch of about 100 µm to about 500 µm.

Referring to FIG. 4, a molding compound 114 is dispensed over logic chip 102 to fill gaps between conductive studs 112 and memory chip 104. Molding compound 114 may include any suitable material such as an epoxy resin, a molding underfill, and the like. Suitable methods for forming molding compound 114 may include compressive molding, transfer molding, liquid encapsulent molding, and the like. For example, molding compound 114 may be dispensed between conductive studs 112/memory chip 104 in liquid form. Subsequently, a curing process is performed to solidify molding compound 114. The filling of molding compound 114 may overflow conductive studs 112/memory chip 104 so that molding compound 114 covers top surfaces of conductive studs 112/memory chip 104. A CMP (or other grinding/etch back technique) may be performed to expose top surfaces of conductive studs 112/memory chip 104. In the resulting structure, exposed surfaces of molding compound 114, conductive studs 112, and memory chip 104 may be substantially level. Furthermore, conductive studs 112 may extend through molding compound 114, and thus, conductive studs 112 may also be referred to as through-molding vias (TMVs) 112. In a top-down view (not shown) of package structure 100, molding compound 114 may encircle memory chip 104. In some embodiments, after the CMP is performed, molding compound 114 may have a thickness of about 70 µm to about 500 µm.

Interconnect structures such as one or more redistribution layers (RDLs) 116 may be formed on memory chip 104 and molding compound 114. Connectors 118 may also be formed on a surface of RDLs 116 opposite memory chip 104. The resulting chip-on-chip package structure 100 is illustrated in FIG. 5. Package structure 100 includes bonded semiconductor chips 102 and 104, conductive studs 112, molding compound 114, RDLs 116, and connectors 118. RDLs 116 may extend laterally past edges of memory chip 104 over molding compound 114 and conductive studs 112. RDLs 116 may include interconnect structures (e.g, conductive lines and/or vias) formed in one or more polymer layers. Polymer layers may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, and the like. The polymer layers may be formed over memory chip 104 while memory chip 104 is oriented over logic chip 102 (e.g., the orientation illustrated in FIGS. 1 through 4).

The interconnect structures in RDLs 116 may be formed in the polymer layers and electrically connect to memory chip 104 and/or logic chip 102 (e.g., using conductive studs 112). The formation of the interconnect structures may include patterning the polymer layers (e.g., using a combination of photolithography and etching processes) and forming the interconnect structures (e.g., depositing a seed layer and using a mask layer to define the shape of the interconnect structures) in the patterned polymer layers. After RDLs 116 are formed, connectors 118 are formed on RDLs 116. Connectors 118 may be control collapse chip connection (C4) bumps having a pitch of about 60 µm to about 200 µm, for example. Subsequently, the orientation of package structure 100 may be flipped as illustrated in FIG. 5.

In FIG. 6, package structure 100 is bonded to a package substrate 124 using connectors 118. For example, a reflow may be performed on connectors 118, and an underfill 120 may be dispensed between package structure 100 and package substrate 124 around connectors 118. Underfill 120 may provide support for connectors 118. Package substrate 124 may be a printed circuit board, an interposer, or the like. Furthermore, package substrate 124 may include interconnect structures (not shown), which may be electrically connected to components in package structure 100 (e.g., logic chip 102 and/or memory chip 104) using connectors 118 and other interconnect structures in package structure 100 (e.g., RDLs 116 and conductive studs 112). Package substrate 124 may extend laterally past edges of package structure 100, and contact pads 122 may be exposed on a top surface of package substrate 124.

FIG. 7 illustrates the attachment of conductive studs 126 to contact pads 122 on package substrate 124. Conductive studs 126 may be substantially similar to conductive studs 112 in package structure 100. For example, conductive studs 112 may be pre-formed structures comprising a conductive material (e.g., copper, silver, gold, and the like) that are attached to contact pads 122. In some embodiments, conductive studs 126 may have a pitch of about 100 µm to about 500 µm.

Figure 8:
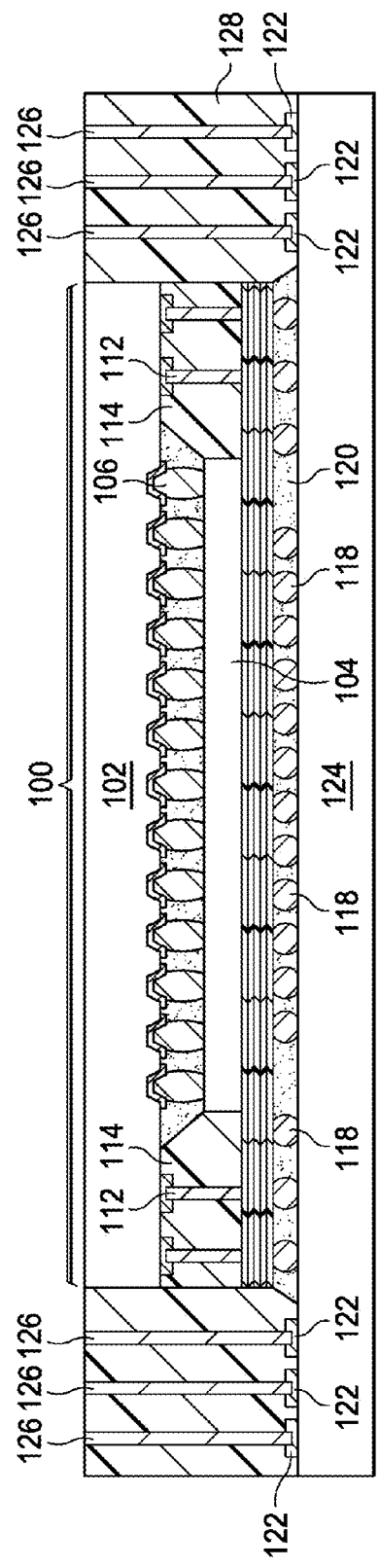

Referring to FIG. 8, a molding compound 128 is dispensed over package substrate 124 to fill gaps between conductive studs 126 and package structure 100. Molding compound 128 may be substantially similar to molding compound 114 in package structure 100. The filling of molding compound 128 may overflow conductive studs 126/package structure 100 so that molding compound 128 covers top surfaces of conductive studs 126/package structure 100. A CMP (or other grinding/etch back technique) may be performed to expose top surfaces of conductive studs 126/package structure 100. In the resulting structure, lateral surfaces of molding compound 128, conductive studs 126, and package structure 100 may be substantially level. Furthermore, conductive studs 126 may extend through molding compound 128, and thus, conductive studs 126 may also be referred to as TMVs 126. In a top-down view (not shown), molding compound 128 may encircle package structure 100. In some embodiments, after the CMP, molding compound 128 may have a thickness of about 140 µm to about 900 µm.

Figure 9:
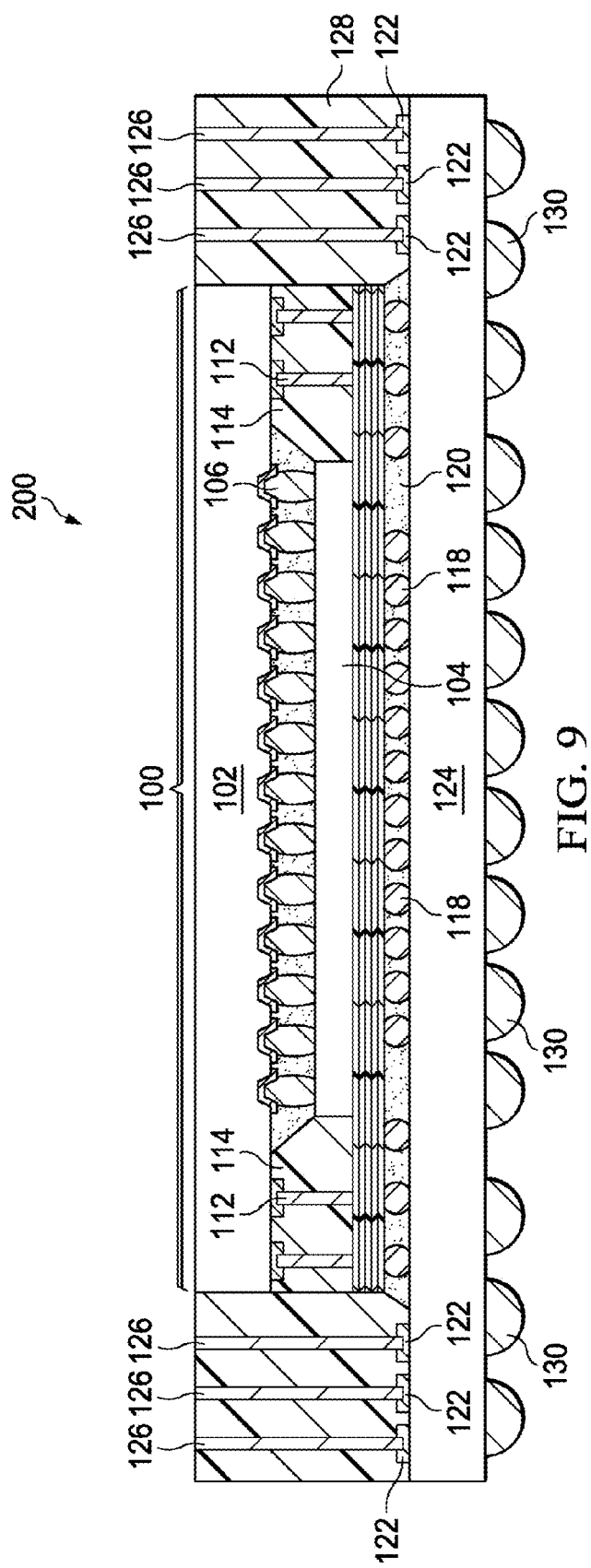

FIG. 9 illustrates the formation of connectors 130 (e.g., ball grid array (BGA) balls) on a surface of package substrate 124 opposing package structure 100. Thus, PoP device 200 is formed. In some embodiments, connectors 130 have a pitch of about 250 µm to about 500 µm. Connectors 130 may be used to electrically connect PoP device 400 to a motherboard (not shown) or another device component of an electrical system.

Figure 10:
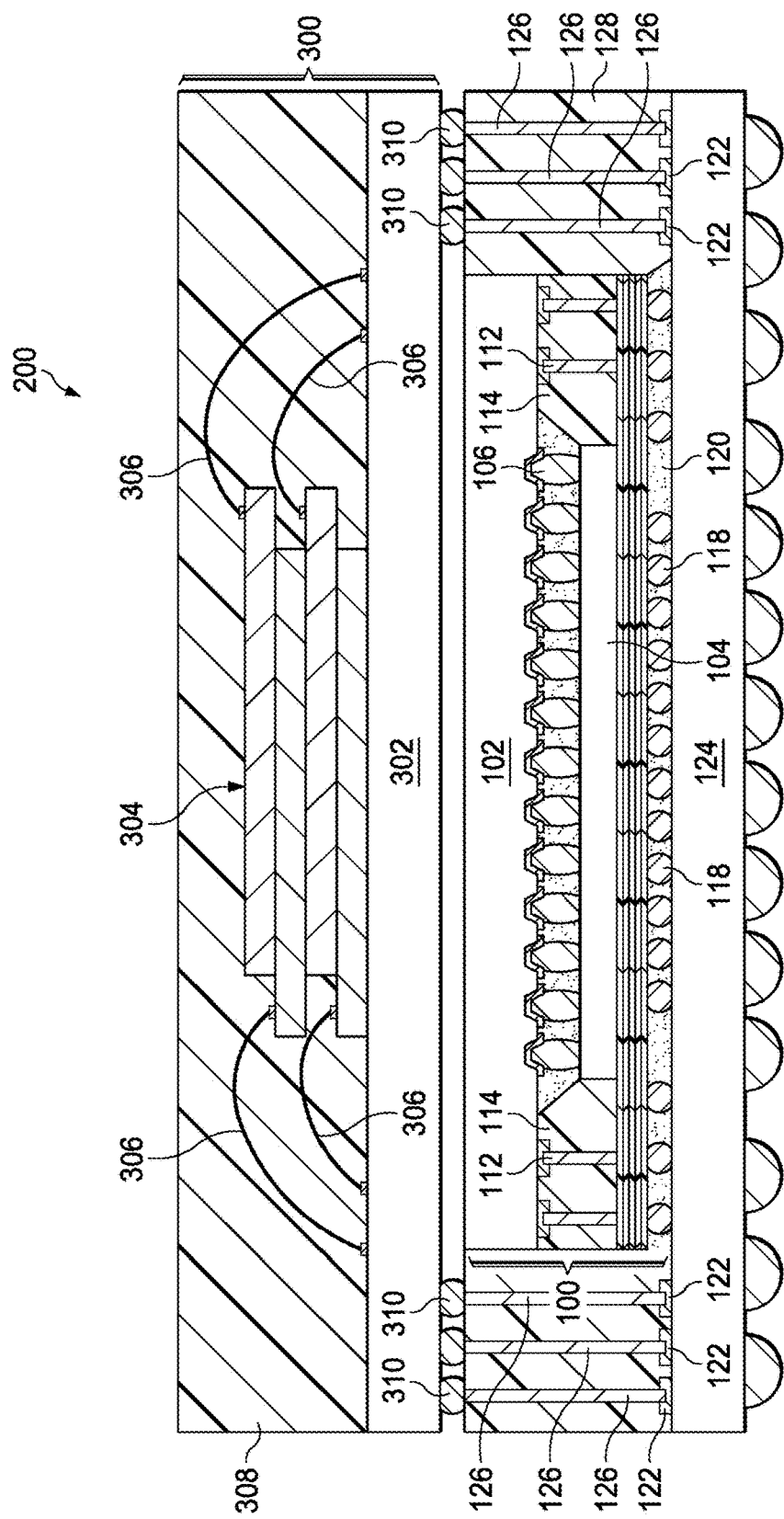

Additional packaging components may be optionally included in PoP device 200. For example, another integrated package (IC) package structure 300 may be electrically connected to package substrate 124 through conductive studs 126. The resulting structure is illustrated in FIG. 10. Package structure 300 may be a memory package, such as a low-power double rate 2 (LP-DDR2) package, LP-DDR3 package, LP-DDR$_x$ package, wide TO package, and the like. Package structure 300 may include a plurality of stacked memory dies (e.g., dynamic random access memory (DRAM) dies 304) bonded to a package substrate 302, for example, using wire bonds 306. DRAM dies 304 and wire bonds 306 may be encased by a protective molding compound 308. Other types of package structures may be used as well. Alternatively, package structure 300 may be omitted depending on package design.

Package substrate 302 may include interconnect structures (e.g., conductive lines and/or vias) that provides electrical connections to various DRAM dies 304. Connectors 310 may be disposed on a bottom surface of package substrate 302. Connectors 310 may bond package structure 300 to conductive studs 126, which may electrically connect package structure 300 to package substrate 126. Logic chip 102 and/or memory chip 104 may be electrically connected to DRAM dies 304 through RDLs 116, package substrate 124, conductive studs 126, and package substrate 302. Thus, by including conductive studs 126 in PoP device 200, additional package structures may be bonded to package structure 100 that are electrically connected to logic chip 102 and/or memory chip 104.

PoP device 200 includes a package structure 100 having bonded semiconductor chips, such as logic chip 102 (e.g., an application processor) and memory chip 104 (e.g., a wide IO chip). Various interconnect/fan-out structures in package structure 100 electrically connect the semiconductor chips to a package substrate. Other interconnect/fan-out structures in PoP device 200 may electrically connect the semiconductor chips to additional package components (e.g., package structure 300 and/or a mother board). Thus, logic (e.g., AP) and memory (e.g., wide IO) chips may be bonded using fan-out, chip-on-chip, and chip-on-substrate package structures (e.g., molding compounds, conductive studs, and RDLs). Advantageous features of PoP device 200 may include one or more of: cost effectiveness (e.g., due to the use of relatively simple interconnect structures without expensive through-substrate vias), increased capacity (e.g., due to the ability to include wide IO chips with other memory chips), improved reliability of electrical connections, improved yield, higher electrical speed (e.g., due to shorter routing distances between logic chip 102 and memory chips 212 and 304), thinner form factors, good level 2 reliability margins (e.g., improved results in temperature cycle (TC) and/or drop tests), and the like.

Figure 11:
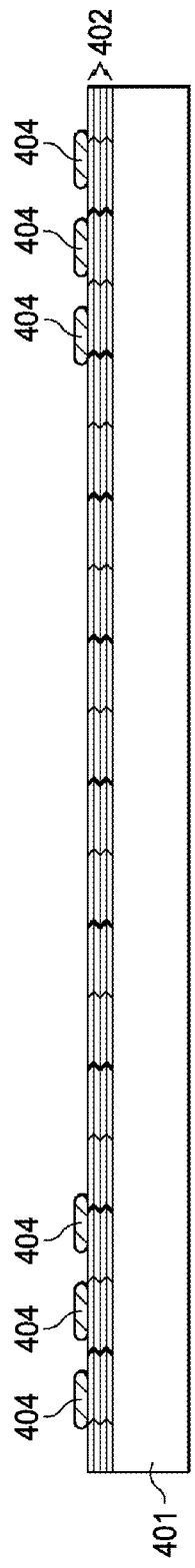
FIGS. 11 through 19 illustrate cross-sectional views of various intermediate stages of manufacturing a PoP device in accordance with some alternative embodiments.

FIGS. 11 through 19 illustrate cross-sectional views of various intermediate stages of manufacturing a PoP device 400 (see FIG. 19) in accordance with some alternative embodiments. FIG. 11 illustrates a cross-sectional view of a carrier 401. Carrier 401 may be a glass carrier or the like. One or more RDLs 402 may be disposed over carrier 101. Conductive portions of RDLs 402 (e.g., a seed layer) may be formed, for example, using a sputtering process, an electroless plating process, and the like. Conductive portions of RDLs 402 may be formed of a conductive material such as copper, titanium, silver, gold, and the like. RDLs 402 may be patterned to include contact pads 404 using a combination of photolithography and etching, for example.

Figure 12:
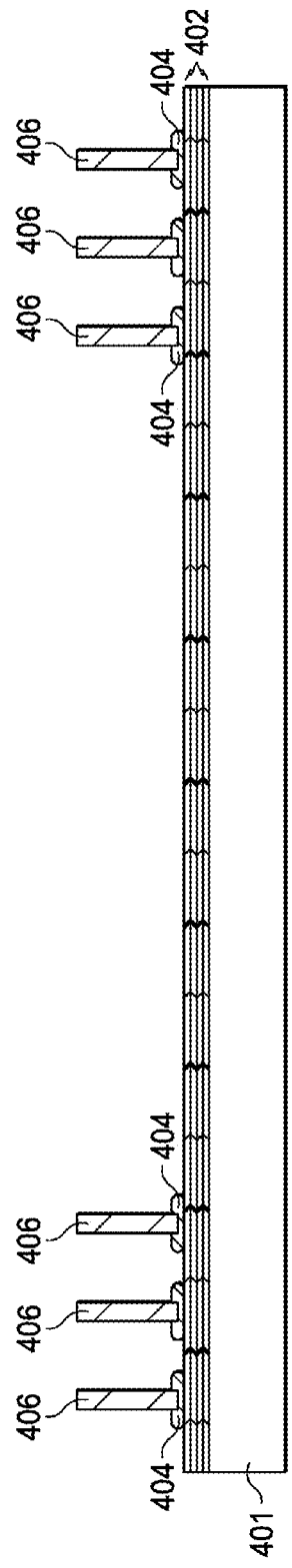

FIG. 12 illustrates the attachment of conductive studs 406 to contact pads 404. Conductive studs 406 may be substantially similar to conductive studs 112 and 126. For example, conductive studs 406 may be pre-formed structures (e.g., comprising copper, silver, gold, and the like) that are attached to contact pads 108. In some embodiments, conductive studs 406 may have a pitch of about 100 µm to about 500 µm.

Figure 13:
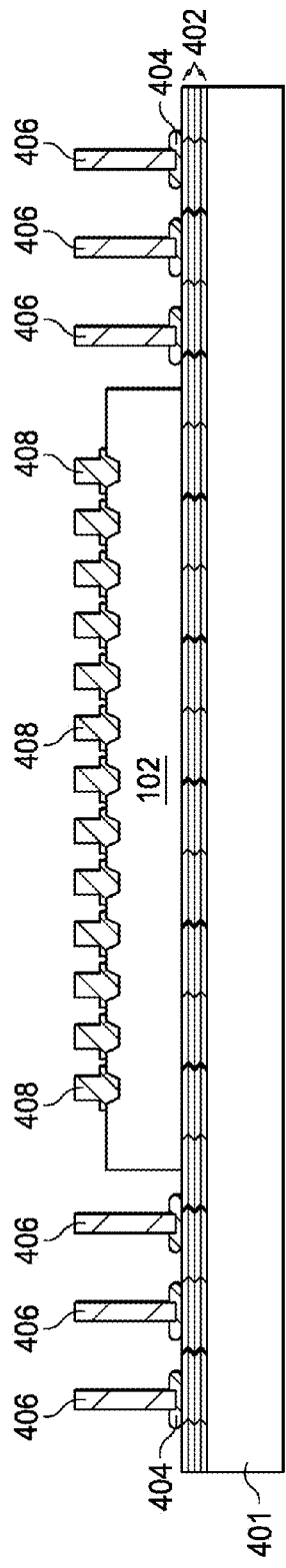

FIG. 13 illustrates the disposition of a semiconductor chip (e.g., logic chip 102) over carrier 401. Logic chip 102 may be an application processor (AP), although other kinds of semiconductor chips (e.g., memory chips) may be used as well. Logic chip 102 includes a plurality of conductive posts 408 (e.g., copper posts) formed on contact pads at a top surface of logic chip 102. Conductive posts 408 may provide electrical connections to active devices/functional circuits in logic chip 102. Logic chip 102 may be disposed over carrier 401 so that conductive posts 408 are facing upwards using, for example, a suitable pick and place tool.

Figure 14:
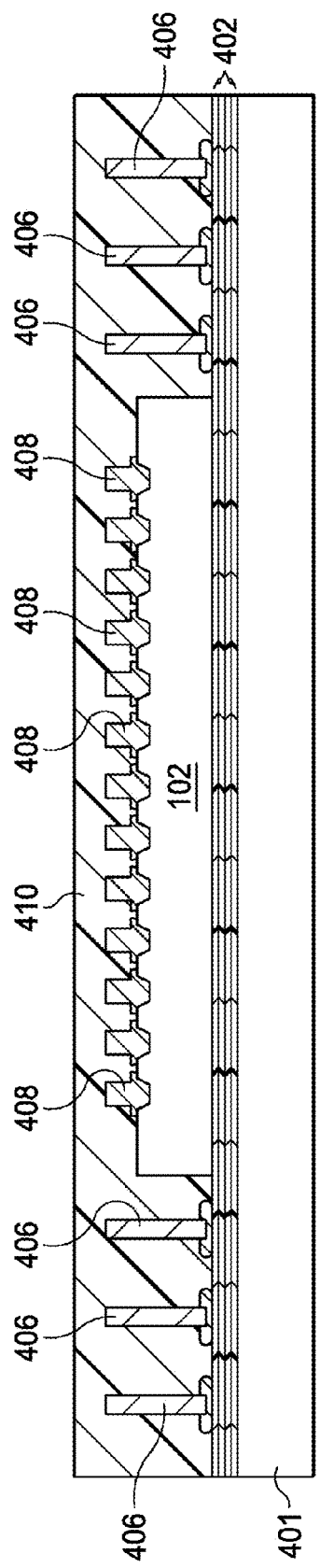

Next, as illustrated by FIG. 14, molding compound 410 is dispensed to fill gaps between conductive studs 406 and logic chip 102. Molding compound 410 may be substantially similar to molding compound 114. For example, molding compound 410 may be dispensed between conductive studs 406/logic chip 102 in liquid form. Subsequently, a curing process is performed to solidify molding compound 410. The filling of molding compound 410 may overflow conductive studs 406/logic chip 102 so that molding compound 410 covers top surfaces of conductive studs 406/logic chip 102.

Figure 15:
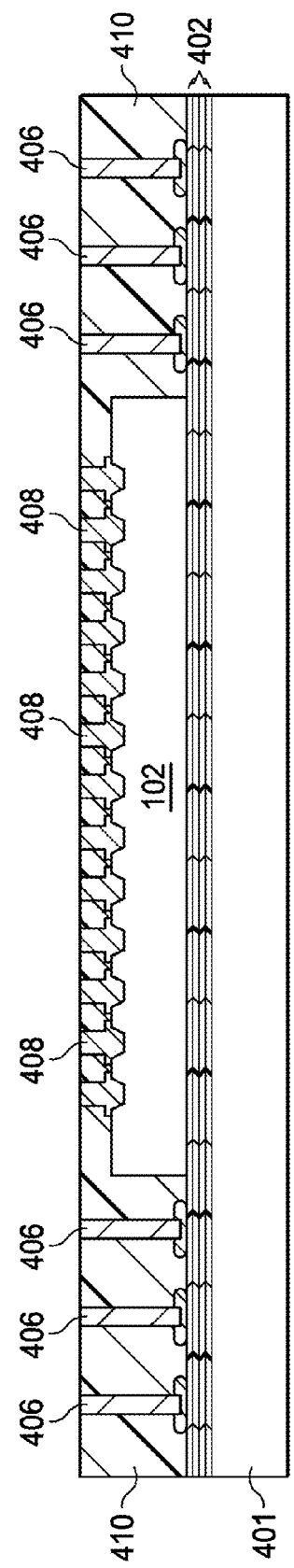

A CMP (or other grinding/etch back technique) may be performed to expose top surfaces of conductive studs 406 and conductive posts 408 on logic chip 102. The resulting structure is illustrated in FIG. 15. After the CMP, lateral surfaces of molding compound 410, conductive studs 406, and conductive posts 408 may be substantially level. Furthermore, conductive posts 408 may protect other features of logic chip 102 during the CMP process from damage. Conductive studs 406 may extend through molding compound 410, and thus, conductive studs 406 may also be referred to as through-molding vias (TMVs) 406. In a top-down view (not shown), molding compound 410 may encircle logic chip 102.

Figure 16:
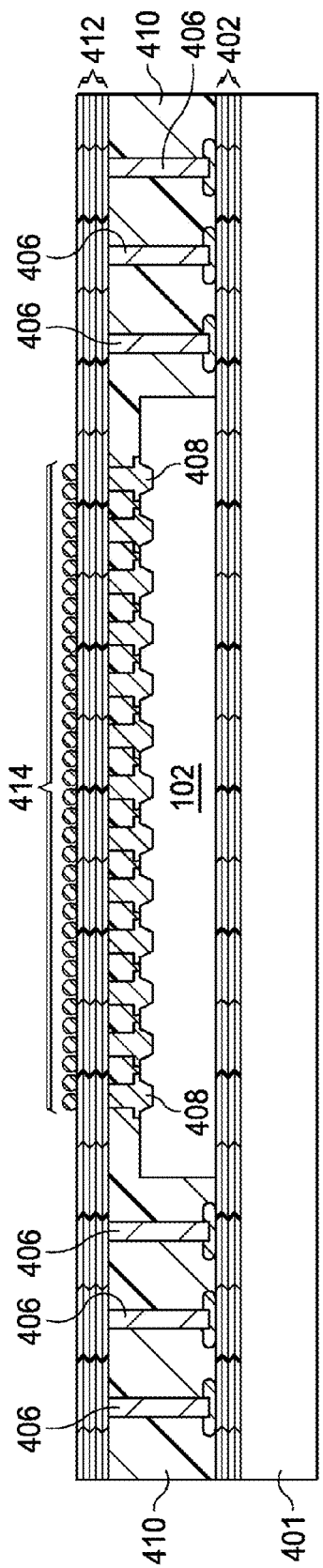

FIG. 16 illustrates the formation of one or more RDLs 412 over logic chip 102. RDLs 412 may be substantially similar to RDLs 116, and RDLs 412 may extend past edges of logic chip 102 over molding compound 410 and conductive studs 406. Connectors 414 are formed over RDLs 412. Connectors 414 may be microbumps having a pitch of about 30 µm to about 100 µm and a standoff height of about 30 µm to about 100 µm, for example. Connectors 414 and RDLs 412 provide electrical connection to logic chip 102 and conductive studs 406.

Figure 17:
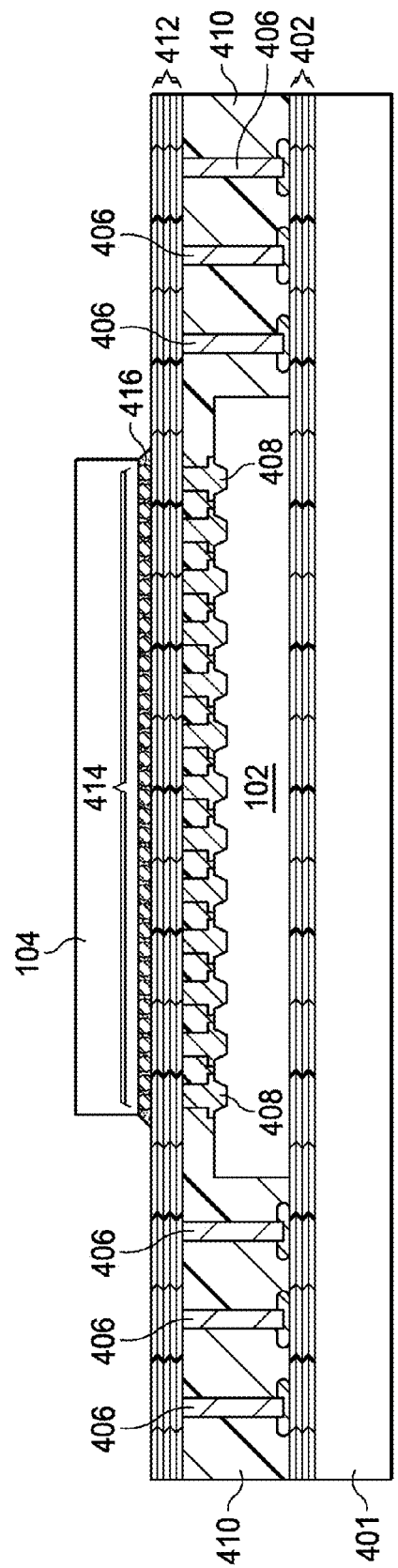

Next, as illustrated by FIG. 17, another semiconductor chip, such as memory chip 104, is bonded to connectors 414. For example, a reflow may be performed on connectors 414. Subsequently, an underfill 416 may be dispensed between logic chip 102 and memory chip 104 around connectors 414. Underfill 416 may provide support for connectors 414. Memory chip 104 may be electrically connected to logic chip 102 through RDLs 412. Memory chip 104 may be a wide IO chip in some embodiments.

Figure 18:
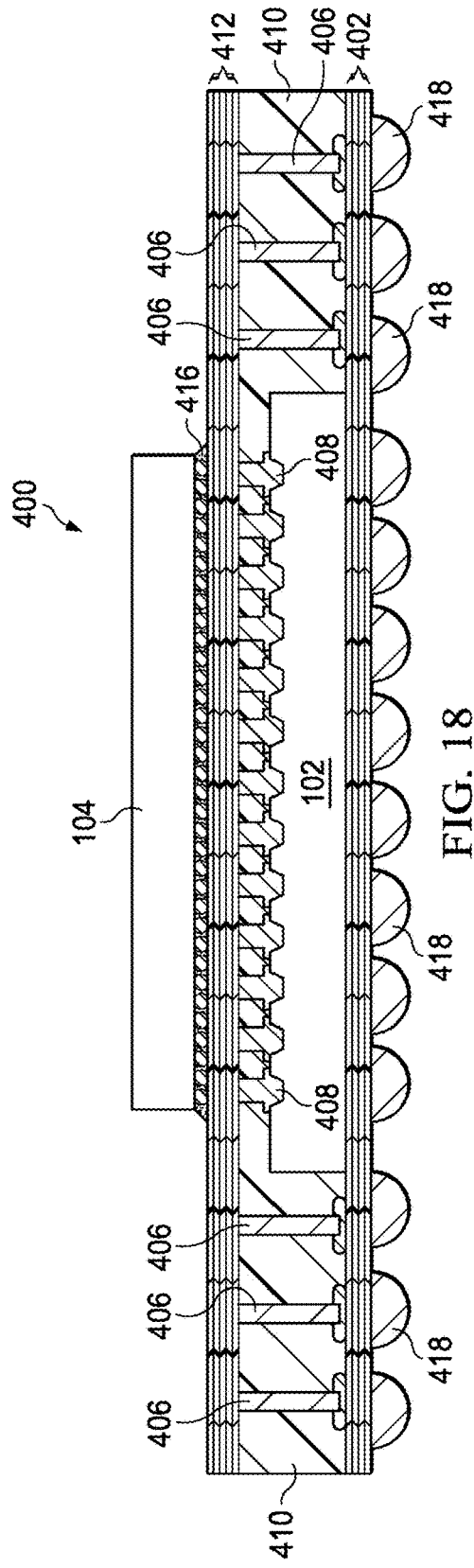

The resulting PoP device 400 is then removed from the carrier, and connectors 418 are disposed on a bottom surface of RDLs 402 opposite logic chip 102 as illustrated by FIG. 18. Connectors 418 may be BGA balls having a pitch of about 250 µm to about 500 µm, for example. Connectors 418 may be used to electrically connect PoP device 400 to a motherboard (not shown) or another device component of an electrical system. Conductive studs 406 (along with other interconnect structures of PoP device 400) provide electrical connection between connectors 418 and memory chip 104.

Figure 19:
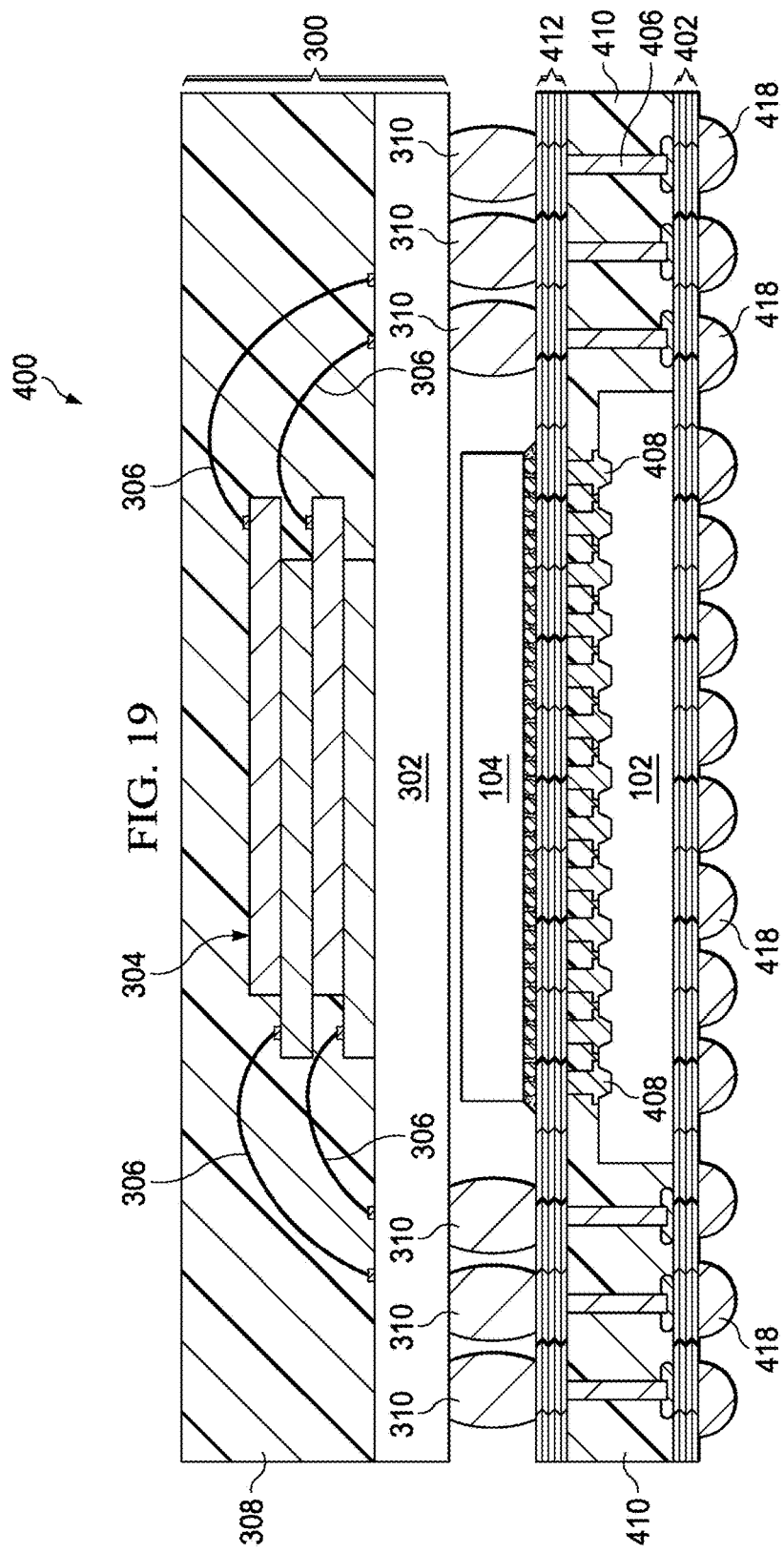

FIG. 19 illustrates the optional bonding of additional packaging components to logic chip 102/memory chip 104 in PoP device 400. For example, package structure 300 may be bonded to an opposing surface of RDLs 412 as logic chip 102. Package structure 300 may be a memory package, such as a LP-DDR2 package, LP-DDR3 package, and the like. Package structure 300 may include a plurality of stacked memory dies (e.g., DRAM dies 304) bonded to a package substrate 302, for example, using wire bonds 306. DRAM dies 304 and wire bonds 306 may be encased by a protective molding compound 308. Other types of package structures may be used as well. Alternatively, package structure 300 may be omitted depending on package design.

Connectors 310 may be disposed on a bottom surface of package substrate 302. Package structure 300 may be bonded to RDLs 412 using connectors 310. Connectors 310 may have a greater vertical dimension than memory chip 104, and memory chip 104 may be disposed between package structure 300 and RDLs 412. Logic chip 102 and/or memory chip 104 may be electrically connected to DRAM dies 304 through RDLs 412 and other interconnect structures in PoP device 400.

Thus, PoP device 400 is completed. PoP device 400 includes a fan-out structure having a logic chip 102, a molding compound 410 encircling logic chip 102, and conductive studs 406 extending through molding compound 410. RDLs 412 are disposed over logic chip 102, molding compound 410, and conductive studs 406. Another semiconductor chip, such as memory chip 104 is bonded to the fan-out structure and electrically connected to logic chip 102 through RDLs 412. Thus, logic (e.g., AP) and memory (e.g., wide IO) chips may be bonded using package structures (e.g., having molding compounds, conductive studs, and/or RDLs). Advantageous features of PoP device 400 may include one or more of: cost effectiveness (e.g., due to the use of relatively simple interconnect structures without expensive through-substrate vias), increased capacity (e.g., due to the ability to include wide IO chips with other memory chips), improved reliability of electrical connections, improved yield, higher electrical speed (e.g., due to shorter routing between logic and memory chips), thinner form factors, good level 2 reliability margins (e.g., improved results in TC/drop tests), and the like.

Figure 20:
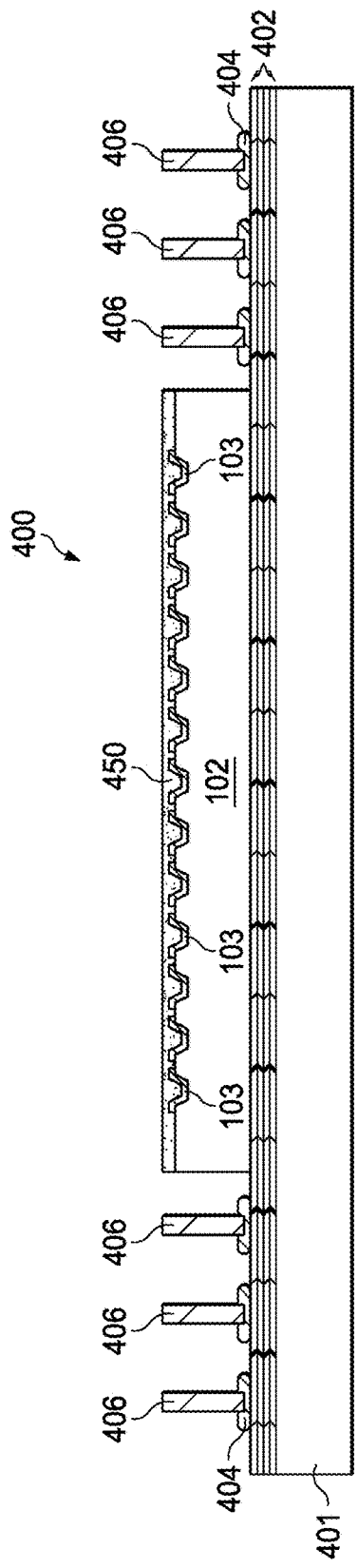
FIGS. 20 through 25 illustrate cross-sectional views of various intermediate stages of manufacturing a PoP device in accordance with some other alternative embodiments.

FIGS. 20 through 25 illustrate cross-sectional views of various intermediate stages of manufacturing PoP device 400 (see FIG. 25) in accordance with some alternative embodiments. FIG. 20 illustrates a cross-sectional view of a carrier 401, RDLs 402, contact pads 404, conductive studs 406, and semiconductor chip 102. The various elements of FIG. 20 may be substantially similar to the elements of FIG. 13, where like reference numerals designate like elements. However, rather than conductive posts 408, a protective layer 450 may be formed over logic chip 102. Protective layer 450 covers contact pads 103 formed at a top surface of logic chip 102. In some embodiments, protective layer 450 may be a protective ultraviolet (UV) tape layer, which may be decomposable using UV light. Logic chip 102 may be disposed over carrier 401 so that protective layer 450 is facing upwards using, for example, a suitable pick and place tool.

Figure 21:
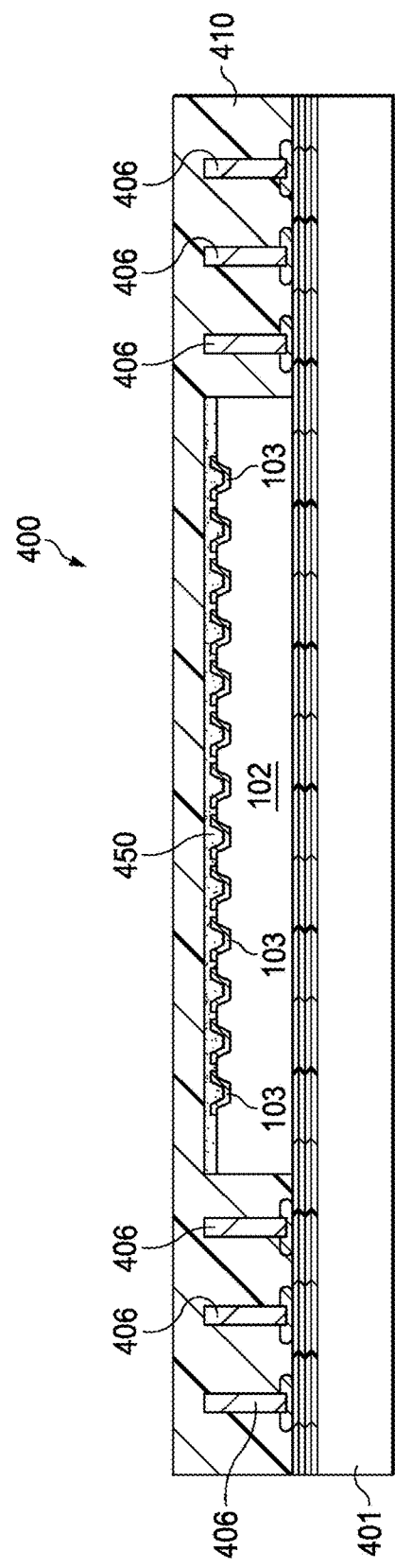

Next, as illustrated by FIG. 21, molding compound 410 is dispensed to fill gaps between conductive studs 406 and logic chip 102. The filling of molding compound 410 may overflow conductive studs 406/logic chip 102 so that molding compound 410 covers top surfaces of conductive studs 406/logic chip 102.

Figure 22:
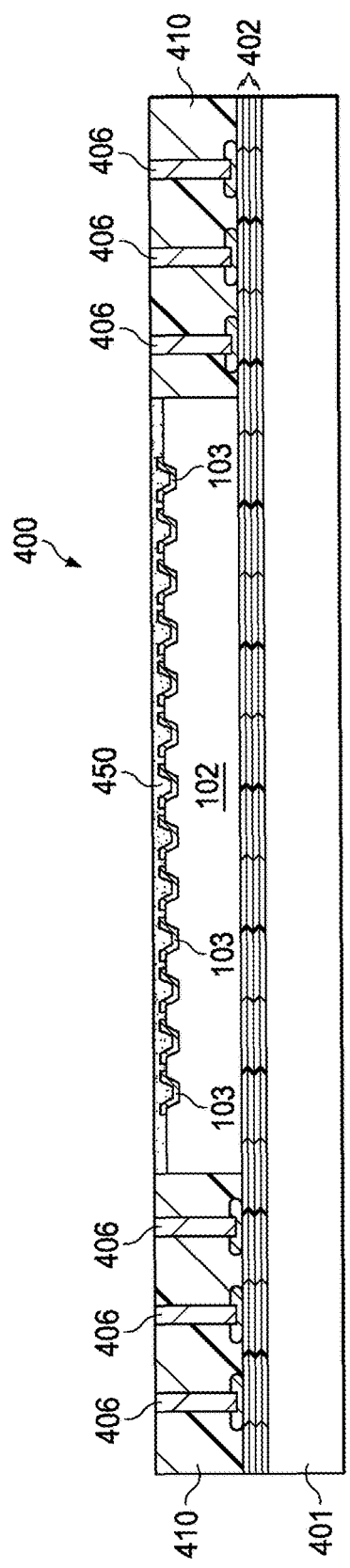

A CMP (or other grinding/etch back technique) may be performed to expose top surfaces of conductive studs 406 and protective layer 450 on logic chip 102. The resulting structure is illustrated in FIG. 22. Protective layer 450 may protect other features of logic chip 102 from damage during the CMP process. Conductive studs 406 may extend through molding compound 410, and thus, conductive studs 406 may also be referred to as through-molding vias (TMVs) 406. In a top-down view (not shown), molding compound 410 may encircle logic chip 102.

Figure 23:
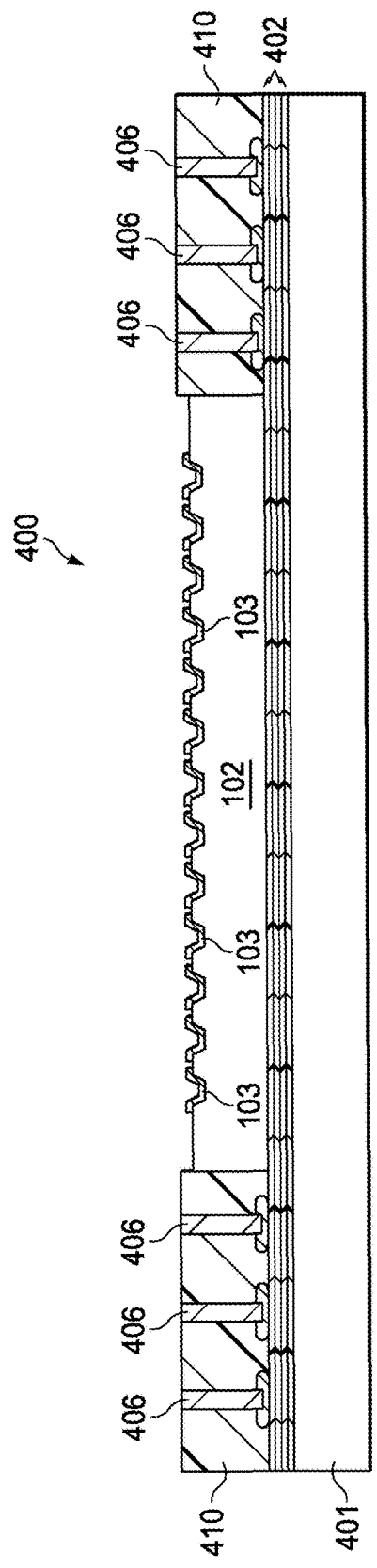

In FIG. 23, protective layer 450 is removed using a de-taping process (e.g., peeling off), exposure to UV light, dissolved using a suitable chemical solution (e.g., an alkaline solution), and the like, for example. By removing protective layer 450, contact pads 103 of logic chip 102 may be exposed. After protective layer 450 is removed, lateral surfaces of molding compound 410 and conductive studs 406 may be higher than logic chip 102.

Figure 24:
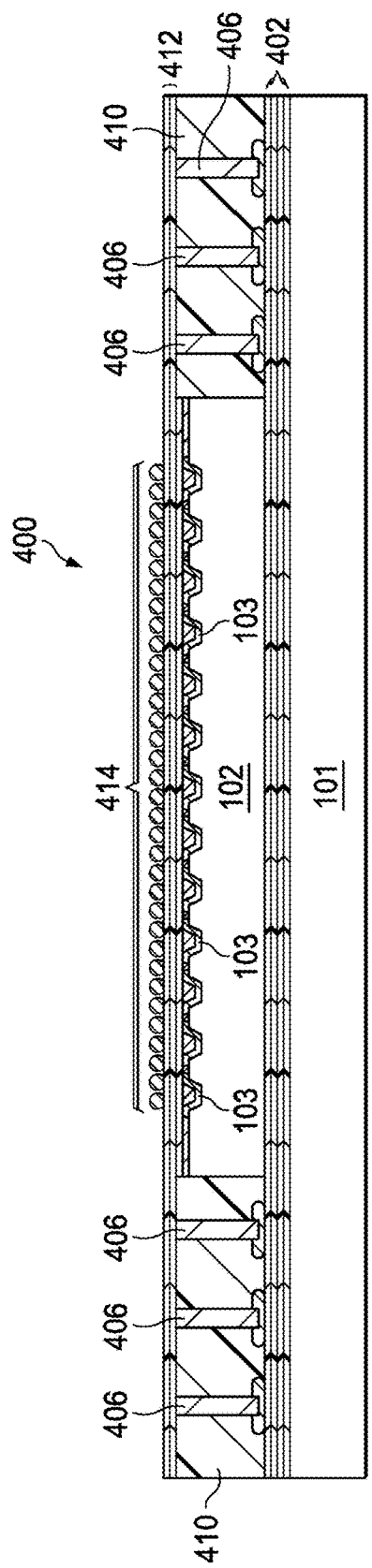

FIG. 24 illustrates the formation of one or more RDLs 412 over to logic chip 102. Because logic chip 102 may be lower than a top surface of molding compound 410, RDLs 412 may extend into molding compound 410 to electrically connect directly to contact pads 103 of logic chip 102. RDLs 412 may further extend past edges of logic chip 102 over molding compound 410 and conductive studs 406. Connectors 414 are then formed over RDLs 412. Connectors 414 and RDLs 412 provide electrical connection to logic chip 102 and conductive studs 406.

Figure 25:
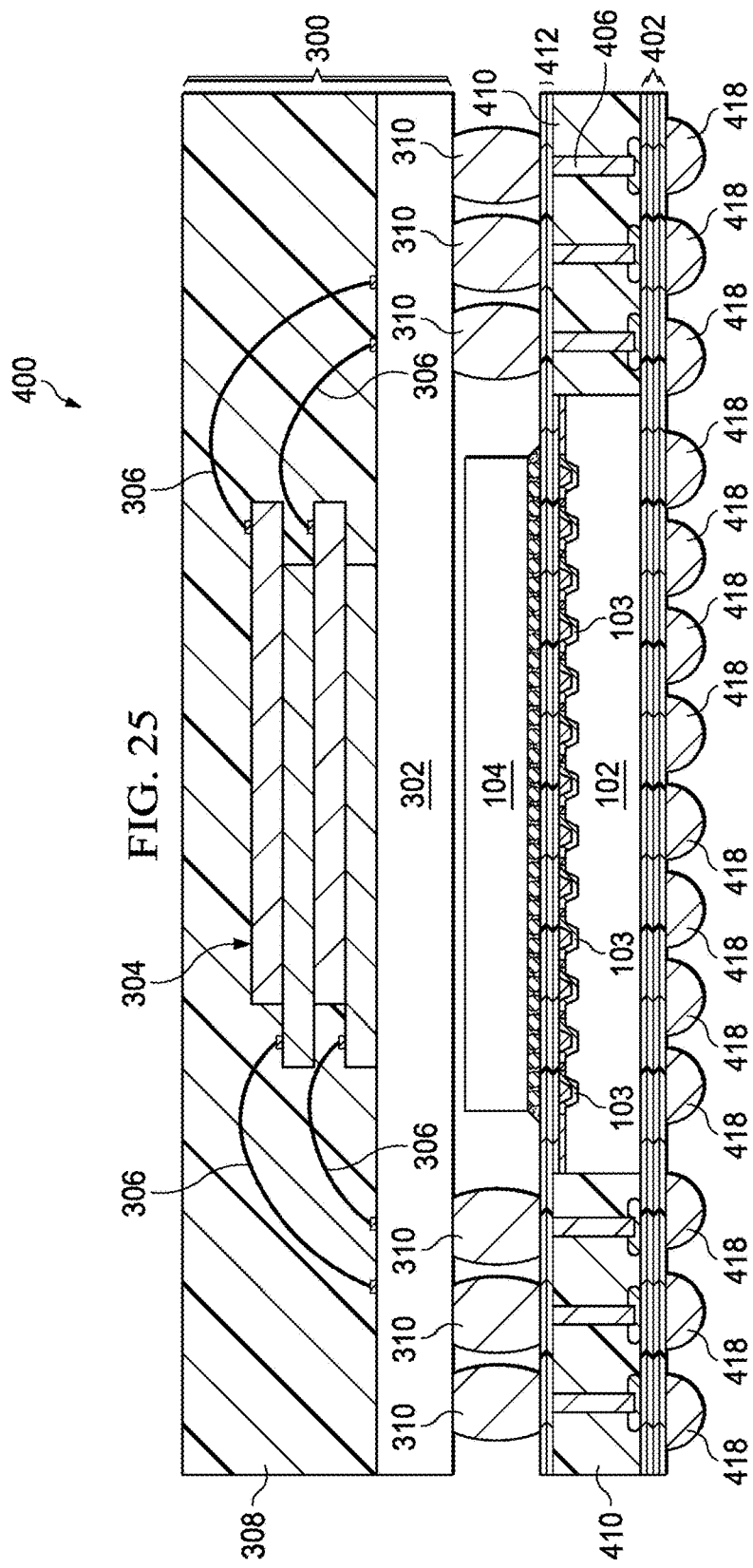

The remaining process steps for forming PoP device may be substantially similar to those described in FIGS. 17 through 19 and are omitted for brevity. FIG. 25 illustrates the completed PoP device 400. Thus, as illustrated by FIGS. 21 through 25, an alternative process may be used to form PoP device where RDLs 412 is directly connected to contact pads 103 in logic chip 102 without any intervening conductive posts 408. In such embodiments, RDLs 412 may extend past a top surface of molding compound 410 due to the inclusion of a protective layer 450 in the process flow.

Thus, as detailed above, various embodiment PoP devices having logic and memory chips may be bonded using various fan-out, chip-on-chip, and chip-on-substrate structures. Advantages of various embodiments may include improved speed and power consumption, lower manufacturing costs, increased capacity, improved yield, thinner form factors, improved level 2 reliability margins, and the like.

In accordance with an embodiment, a package-on-package (PoP) device includes a package structure, a package substrate, and a plurality of connectors bonding the package structure to the package substrate. The package structure includes a logic chip bonded to a memory chip, a molding compound encircling the memory chip, and a plurality of conductive studs extending through the molding compound. The plurality of conductive studs is attached to contact pads on the logic chip.

In accordance with another embodiment, a package-on-package (PoP) device includes a logic chip, a molding compound encircling the logic chip, and one or more first redistribution layers (RDLs) over the logic chip and the molding compound. The PoP device further includes a plurality of through-molding vias (TMVs) extending through the molding compound and attached to one or more second RDLs. The one or more second RDLs are disposed under the first molding compound and the logic chip. A memory chip is disposed over the one or more first RDLs, and the one or more first RDLs electrically connects the memory chip to the logic chip and the plurality of TMVs.

In accordance with yet another embodiment, a method for forming a package on package (PoP) device includes forming a first package structure and bonding the first package structure to a package substrate. The method of forming the first package structure includes bonding a logic chip to a memory chip (where the logic chip comprises a first plurality of contact pads), attaching a first plurality of pre-formed conductive studs to the first plurality of contact pads, and dispensing a first molding compound over the logic chip between the memory chip and each of the plurality of pre-formed conductive studs. The method further includes attaching a second plurality of pre-formed conductive studs to a second plurality of contact pads on the package substrate, and dispensing a second molding compound over the package substrate between the first package structure and each of the second plurality of conductive studs.

An embodiment is a package-on-package (PoP) device including: a logic chip having an active side and a back side, the back side being opposite the active side, the active side including a plurality of conductive posts; a first molding compound encircling the logic chip; a plurality of through-molding vias (TMVs) adjacent the logic chip, extending through the first molding compound, and attached to one or more first redistribution layers (RDLs), wherein the one or more first RDLs are disposed under the first molding compound and the logic chip, the back side of the logic chip facing the one or more first RDLs; one or more second RDLs over the logic chip and the first molding compound, the active side of the logic chip facing the one or more second RDLs, wherein the plurality of TMVs extend from the one or more first RDLs to the one or more second RDLs, and wherein an entirety of the TMVs are disposed in the first molding compound; and a memory chip over the one or more second RDLs, the memory chip having an active side and a back side, the back side being opposite the active side, the active side including a first plurality of conductive connectors coupled to the one or more second RDLs, the active side of the memory chip facing the one or more second RDLs, the one or more second RDLs being interposed between the active sides of the memory chip and the logic chip, wherein the one or more second RDLs electrically connects the memory chip to the logic chip and the plurality of TMVs.

An embodiment is a method including: forming a first package structure, wherein forming the first package structure includes: bonding a logic chip to a memory chip, wherein the logic chip includes a first plurality of contact pads; attaching a first plurality of pre-formed conductive studs to the first plurality of contact pads; dispensing a first molding compound over the logic chip between the memory chip and each of the first plurality of pre-formed conductive studs; bonding the first package structure to a package substrate, wherein the package substrate includes a second plurality of contact pads; attaching a second plurality of pre-formed conductive studs to the second plurality of contact pads; and dispensing a second molding compound over the package substrate between the first package structure and each of the second plurality of pre-formed conductive studs.

An embodiment is a structure including: a first redistribution structure including a one or more conductive lines and vias in one or more insulating layers; a logic chip over the first redistribution structure, the logic chip having an active side and a back side, the active side including a plurality of contact pads, the back side of the logic chip facing the first redistribution structure; a first molding compound over the first redistribution structure and encircling the logic chip; a plurality of electrical connectors adjacent the logic chip and extending through the first molding compound; a second redistribution structure over the active side of the logic chip, the first molding compound, and the plurality of electrical connectors, the second redistribution structure including one or more conductive lines and vias in one or more insulating layers, the plurality of electrical connectors being electrically connected to the first redistribution structure and the second redistribution structure; and a memory chip over the second redistribution structure, the memory chip having an active side and a back side, the active side facing the second redistribution structure and including a first plurality of conductive connectors coupled to the second redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package-on-package (PoP) device comprising:
   a logic chip having an active side and a back side, the back side being opposite the active side, the active side comprising a plurality of conductive posts extending from the logic chip, the plurality of conductive posts extending below and above a first outer surface of the logic chip, the plurality of conductive posts having a same material composition below and above the first outer surface of the logic chip;
   a first molding compound encircling the logic chip, the first molding compound contacting the first outer surface of the logic chip and encircling each of the plurality of conductive posts;
   a plurality of through-molding vias (TMVs) adjacent the logic chip, extending through the first molding compound, and attached to one or more first redistribution layers (RDLs), wherein the one or more first RDLs are disposed under the first molding compound and the logic chip, the back side of the logic chip facing the one or more first RDLs, wherein top surfaces of the conductive posts, the first molding compound, and the plurality of TMVs are substantially level;
   one or more second RDLs over the logic chip and the first molding compound, the active side of the logic chip facing the one or more second RDLs, wherein the plurality of TMVs extend from the one or more first RDLs to the one or more second RDLs, and wherein an entirety of the TMVs are disposed in the first molding compound;
   a memory chip over the one or more second RDLs, the memory chip having an active side and a back side, the back side being opposite the active side, the active side comprising a plurality of microbumps coupled to a top surface of the one or more second RDLs, the microbumps having a first pitch, the active side of the memory chip facing the one or more second RDLs, the one or more second RDLs being interposed between the active sides of the memory chip and the logic chip, wherein the one or more second RDLs electrically connects the memory chip to the logic chip and the plurality of TMVs; and
   a plurality of conductive connectors coupled to the top surface of the one or more second RDLs, the conductive connectors having a second pitch, the second pitch being greater than the first pitch.

2. The PoP device of claim 1, wherein the plurality of conductive posts are electrically connected to the one or more second RDLs.

3. The PoP device of claim 1, further comprising:
a package structure electrically connected to the one or more second RDLs.

4. The PoP device of claim 3, wherein the package structure is a low-power double data rate (LP-DDR) 2 package or a LP-DDR3 package.

5. The PoP device of claim 4 wherein the conductive connectors bond the package structure to the top surface of the one or more second RDLs, each of the plurality of conductive connectors being larger than each of the plurality of microbumps, wherein the memory chip is disposed between the package structure and the one or more second RDLs.

6. A structure comprising:
a first redistribution structure comprising a one or more conductive lines and vias in one or more insulating layers;
a logic chip over the first redistribution structure, the logic chip having an active side and a back side, the active side comprising a plurality of contact pads, the back side of the logic chip facing the first redistribution structure;
a first molding compound over the first redistribution structure and encircling the logic chip;
a plurality of electrical connectors adjacent the logic chip and extending through the first molding compound, each of the plurality of electrical connectors comprising a contact pad on the first redistribution structure and a conductive wire on the contact pad, the conductive wire having a lower surface below an upper surface of the contact pad, a combined height of the contact pad and the conductive wire being equal to a height of the first molding compound, the first molding compound contacting sidewalls of the contact pad and sidewalls of the conductive wire;
a second redistribution structure over the active side of the logic chip, the first molding compound, and the plurality of electrical connectors, the second redistribution structure comprising one or more conductive lines and vias in one or more insulating layers, the plurality of electrical connectors being electrically connected to the first redistribution structure and the second redistribution structure; and
a memory chip over the second redistribution structure, the memory chip having an active side and a back side, the active side facing the second redistribution structure and comprising a first plurality of conductive connectors coupled to the second redistribution structure.

7. The structure of claim 6, wherein the plurality of electrical connectors extend from the first redistribution structure to the second redistribution structure.

8. The structure of claim 6 further comprising:
a second package structure; and
a second plurality of conductive connectors electrically connecting the second package structure to the second redistribution structure, wherein the second plurality of conductive connectors are bonded to the second redistribution structure.

9. The structure of claim 8, wherein the second package structure comprises:
a plurality of stacked dynamic random access memory (DRAM) chips;
a package substrate bonded to the plurality of stacked DRAM chips; and
a second molding compound encasing the plurality of stacked DRAM chips.

10. The structure of claim 6, wherein the logic chip further comprises a plurality of conductive posts on the plurality of contact pads of the logic chip, the plurality of conductive posts being between the contact pads and the second redistribution structure, the plurality of conductive posts electrically connecting the logic chip to the second redistribution structure.

11. The structure of claim 10, wherein top surfaces of the plurality of conductive posts, the first molding compound, and the plurality of electrical connectors are substantially level.

12. The structure of claim 6, wherein the second redistribution structure is physically contacting the contact pads of the logic chip.

13. The structure of claim 12 wherein a top surface of the first molding compound is higher than a top surface of the logic chip, and wherein the second redistribution structure extends partially into the first molding compound and electrically connects directly to contact pads at the top surface of the logic chip.

14. The structure of claim 6, wherein the logic chip is an application processor, and wherein the memory chip is a wide input/output chip.

15. A package-on-package (PoP) structure comprising:
a first package structure comprising:
a first redistribution structure comprising a one or more conductive lines and vias in one or more insulating layers;
a first chip over the first redistribution structure, the first chip having an active side and a back side, the active side comprising contact pads, the back side of the first chip facing the first redistribution structure;
a first molding compound over the first redistribution structure and at least laterally encapsulating the first chip;
electrical connectors adjacent the first chip and extending through the first molding compound, each of the electrical connectors comprising a contact pad on the first redistribution structure and a conductive wire on the contact pad, the conductive wire having a lower surface below an upper surface of the contact pad, a combined height of the contact pad and the conductive wire being equal to a height of the first molding compound, the first molding compound contacting sidewalls of the contact pad and sidewalls of the conductive wire;
a second redistribution structure over the active side of the first chip, the first molding compound, and the electrical connectors, the second redistribution structure comprising one or more conductive lines and vias in one or more insulating layers, the electrical connectors being electrically connected to the first redistribution structure and the second redistribution structure, the second redistribution structure being electrically connected to the first chip; and
a second chip over the second redistribution structure, the second chip having an active side and a back side, the active side facing the second redistribution structure and comprising a plurality of microbumps coupled to the second redistribution structure, the microbumps having a first pitch, the second chip being electrically connected to the second redistribution structure;

a second package structure over the back side of the second chip and the second redistribution structure; and a plurality of conductive connectors electrically connecting the second package structure to the second redistribution structure, the conductive connectors having a second pitch, the second pitch being greater than the first pitch.

16. The PoP structure of claim 15, wherein the first chip further comprises conductive posts on the contact pads of the first chip, the conductive posts being between the contact pads and the second redistribution structure, the conductive posts electrically connecting the first chip to the second redistribution structure, the first molding compound contacting an active surface of the first chip and encircling each of the conductive posts.

17. The PoP structure of claim 16, wherein top surfaces of the conductive posts, the first molding compound, and the electrical connectors are substantially level.

18. The PoP structure of claim 15, wherein the second redistribution structure is physically contacting the contact pads of the first chip.

19. The PoP structure of claim 15, wherein the conductive connectors have a greater vertical dimension than the second chip.

* * * * *